United States Patent
An et al.

(10) Patent No.: US 7,777,212 B2
(45) Date of Patent: Aug. 17, 2010

(54) PHASE CHANGE MEMORY DEVICES INCLUDING CARBON-CONTAINING ADHESIVE PATTERN

(75) Inventors: Hyeong-Geun An, Hwaseong-si (KR); Hideki Horii, Seoul (KR); Min-Young Park, Suwon-si (KR); Shin-Hye Kim, Suwon-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 11/972,198

(22) Filed: Jan. 10, 2008

(65) Prior Publication Data

US 2008/0173858 A1 Jul. 24, 2008

(30) Foreign Application Priority Data

Jan. 23, 2007 (KR) .................. 10-2007-0007133

(51) Int. Cl.
H01L 29/02 (2006.01)
(52) U.S. Cl. ............... 257/2; 257/3; 257/4; 257/5; 257/E29.002; 438/102; 438/103; 365/163
(58) Field of Classification Search .............. 257/1–5, 257/E29.002; 438/102–103; 365/163
See application file for complete search history.

(56) References Cited

U.S. PATENT DOCUMENTS

| | | | |
|---|---|---|---|
| 5,359,205 A * | 10/1994 | Ovshinsky | ............ 257/3 |
| 5,681,632 A * | 10/1997 | Kitaura et al. | ............ 428/64.1 |
| 6,031,757 A | 2/2000 | Chuang et al. | |
| 6,545,287 B2 | 4/2003 | Chiang | |
| 6,566,700 B2 | 5/2003 | Xu | |
| 6,731,536 B1 | 5/2004 | McClain et al. | |
| 6,970,381 B2 | 11/2005 | Nakata | |
| 7,282,730 B2 | 10/2007 | Czubatyj et al. | |
| 2003/0073295 A1 * | 4/2003 | Xu | .............. 438/518 |
| 2004/0251551 A1 | 12/2004 | Hideki | |
| 2005/0237800 A1 | 10/2005 | Kurosaki | |
| 2006/0118913 A1 | 6/2006 | Yi et al. | |

FOREIGN PATENT DOCUMENTS

| | | |
|---|---|---|
| JP | 2006-352092 A | 12/2006 |
| JP | 2008-165356 A | 7/2008 |
| KR | 10-2004-0054250 A | 6/2004 |
| KR | 10-0504701 B1 | 7/2005 |
| KR | 10-2006-0062979 A | 6/2006 |
| KR | 10-2007-0031714 A | 3/2007 |

* cited by examiner

*Primary Examiner*—Bradley K Smith
*Assistant Examiner*—Jami M Valentine
(74) *Attorney, Agent, or Firm*—Myers Bigel Sibley & Sajovec, P.A.

(57) ABSTRACT

Phase change memory devices include a heating electrode on a substrate and a phase change material pattern on the heating electrode. An adhesive pattern is disposed between the heating electrode and the phase change material pattern. The adhesive pattern contains carbon. Methods of fabricating phase change memory devices are also provided.

13 Claims, 8 Drawing Sheets

Fig. 1

(CONVENTIONAL ART)

PHASE CHANGE MEMORY DEVICES INCLUDING CARBON-CONTAINING ADHESIVE PATTERN

CROSS-REFERENCE TO RELATED APPLICATION

This application claims the benefit under 35 U.S.C. §119 of Korean Patent Application No. 10-2007-0007133, filed on Jan. 23, 2007, the disclosure of which is hereby incorporated herein by reference in its entirety as if set forth fully herein.

BACKGROUND

The present invention relates to semiconductor devices and methods of fabricating the same and, more particularly, to phase change memory devices and methods of fabricating the same.

Phase change memory devices are a type of nonvolatile memory device which retain their stored data even when their power supplies are interrupted. The phase change memory devices may employ a phase change material as a data storage element having two stable states. The phase change material may exhibit one of two stable states, for example, an amorphous state or a crystalline state according to a temperature of the phase change material and a time period within which the temperature is maintained. The phase change material having the amorphous state may exhibit a higher resistivity than that of the phase change material having the crystalline state.

The phase change memory device may have a plurality of unit cells, and each of the unit cells may include the phase change material layer. The phase change memory cell may be programmed by heating the phase change material layer to have one of the two stable states, and the data stored in the programmed cell may be read out by discriminating whether or not a first current flowing through a selected unit cell is higher than a second current flowing through a reference cell. For example, the data stored in the selected unit cell may be regarded as a logic "1" when the first current is higher than the second current, and the data stored in the selected cell may be regarded as a logic "0" when the first current is lower than the second current. An alloy material containing germanium (Ge), stibium (Sb) and tellurium (Te) (hereinafter, referred to as "GST") is widely used as the phase change material.

In general, the unit cell of the phase change memory device may include a GST pattern and a conductor heating the GST pattern.

Figure 1:
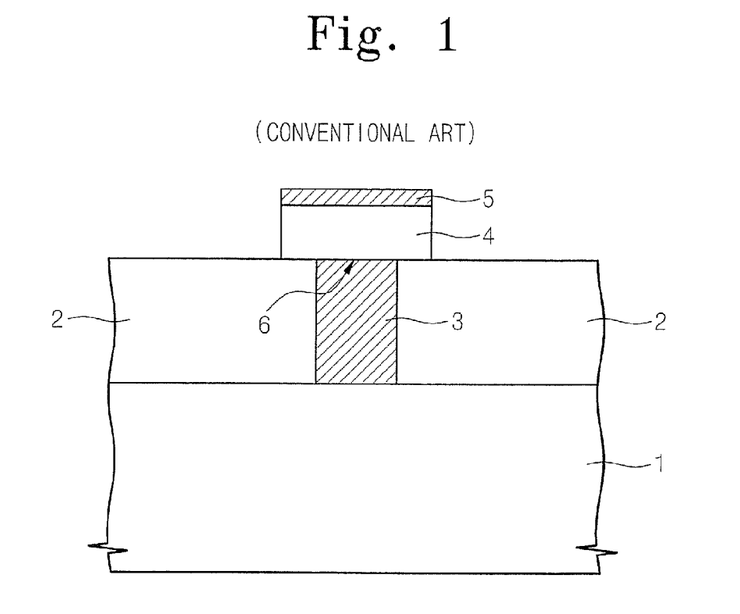
FIG. 1 is a cross sectional view illustrating a conventional phase change memory device.

FIG. 1 is a cross sectional view illustrating a unit cell of a conventional phase change memory device.

Referring to FIG. 1, an interlayer oxide layer 2 is disposed on an integrated circuit substrate such as a semiconductor substrate 1, and a titanium nitride (TiN) plug 3 may be disposed to penetrate the interlayer oxide layer 2. A GST pattern 4 and a conductive pattern 5 are sequentially stacked on the interlayer oxide layer 2. The GST pattern 4 may be in contact with a top surface of the TiN plug 3.

In the conventional phase change memory device described above, a program current may be supplied to flow through the TiN plug 3, the GST pattern 4 and the conductive pattern 5. The program current flowing through the TiN plug 3 may generate joule heat, and the GST pattern 4 may be heated up to a predetermined temperature by the joule heat. The GST pattern 4 may be changed into an amorphous state or a crystalline state according to the temperature of the GST pattern 4 and a time period within which the temperature is maintained. Typically, the joule heat may be generated at a vicinity of an interface 6 between the TiN plug 3 and the GST pattern 4. This is because an area of the interface 6 between the TiN plug 3 and the GST pattern 4 is often less than that of the interface between the GST pattern 4 and the conductive pattern 5.

When the program operation is repeatedly performed on a specific phase change memory cell, the interface characteristic between the GST pattern 4 and the TiN plug 3 of the specific phase change memory cell may be degraded. For example, when the number of the program operation is increased, adhesion between the GST pattern 4 and the TiN plug 3 may be weakened to cause a lifting phenomenon of the GST pattern 4. As a result, the endurance characteristic of the phase change memory device may be significantly degraded.

SUMMARY OF THE INVENTION

Exemplary embodiments of the present invention are directed to phase change memory devices and methods of fabricating the same. In some exemplary embodiments, a phase change memory device comprises a heating electrode on a substrate and a phase change material pattern on the substrate. An adhesive pattern is disposed between the heating electrode and the phase change material pattern. The adhesive pattern comprises carbon. In some embodiments, the adhesive material consists essentially of carbon. In other embodiments, the adhesive material comprises a chemical compound that includes carbon.

In some embodiments, the phase change memory device may further comprise an interlayer insulating layer disposed on the substrate. In this case, the heating electrode may be disposed in an opening which penetrates the interlayer insulating layer. The heating electrode may have a top surface which is substantially coplanar with a top surface of the interlayer insulating layer, the adhesive pattern and the phase change material pattern may be sequentially stacked on the interlayer insulating layer, and the adhesive pattern may be in direct contact with the top surface of the heating electrode. Alternatively, the heating electrode may be in and may fill a lower portion of the opening, at least a portion of the phase change material pattern may be disposed in an upper portion of the opening, and the adhesive pattern may be disposed between the top surface of the heating electrode and a bottom surface of the phase change material pattern in the opening. In this case, a top surface of the phase change material pattern may be substantially coplanar with a top surface of the interlayer insulating layer.

In other embodiments, the device may further comprise an interconnection disposed on the interlayer insulating layer. The interconnection may be electrically connected to the phase change material pattern. The top surface of the phase change material pattern may be located at a higher level (i.e., further away from the substrate) than the top surface of the interlayer insulating layer, and the phase change material pattern may cover a top surface of the interlayer insulating layer outside the opening. Moreover, an edge of the adhesive pattern may extend to intervene between the phase change material pattern and the interlayer insulating layer. The phase change material pattern, the extension of the adhesive pattern and the interlayer insulating layer may have top surfaces which are substantially coplanar with each other.

In other embodiments, a portion of the phase change material pattern adjacent to the adhesive pattern may also contain carbon. In still other embodiments, a portion of the phase change material pattern remote from the adhesive pattern may be free of carbon. In still other embodiments, a concentration of carbon in the phase change material pattern may decrease (for example, linearly or exponentially) as a function of distance away from the adhesive pattern.

In other exemplary embodiments, methods of fabricating the phase change memory device comprise forming a heating electrode on a substrate, forming an adhesive pattern on the heating electrode and forming a phase change material pattern on the adhesive pattern. The adhesive pattern may be formed of a carbon containing material.

In some embodiments, forming the heating electrode may comprise forming an interlayer insulating layer on a substrate, forming an opening which penetrates the interlayer insulating layer, and forming a heating electrode in the opening.

In other embodiments, the heating electrode may be formed to have a top surface which is substantially coplanar with a top surface of the interlayer insulating layer. In this case, forming the adhesive pattern and the phase change material pattern may comprise sequentially forming an adhesive layer and a phase change material layer on the substrate including the heating electrode, and patterning the phase change material layer and the adhesive layer to form an adhesive pattern and a phase change material pattern which are sequentially stacked.

In yet other embodiments, the heating electrode may be formed in and may fill a lower portion of the opening, at least a portion of the phase change material pattern may be formed in and may fill an upper portion of the opening, and the adhesive pattern may be formed to intervene between a top surface of the heating electrode and a bottom surface of the phase change material pattern in the opening. Forming the adhesive pattern and the phase change material pattern may comprise forming an adhesive layer on the substrate including the heating electrode in and may fill the opening on the heating electrode, planarizing the adhesive layer until the interlayer insulating layer is exposed, and recessing the planarized adhesive layer to form an adhesive pattern having a top surface which is lower than a top surface of the interlayer insulating layer. In this case, forming the phase change material pattern may comprise forming a phase change material layer on the substrate including the adhesive pattern in and may fill the opening on the adhesive pattern, and patterning the phase change material layer. Alternatively, forming the phase change material pattern may comprise forming a phase change material layer on the substrate including the adhesive pattern in and may fill the opening on the adhesive pattern, and planarizing the phase change material layer until the interlayer insulating layer is exposed.

In still other embodiments, forming the adhesive pattern and the phase change material pattern may comprise conformably forming an adhesive layer on the substrate including the heating electrode, and forming a phase change material layer on the adhesive layer in and may fill the opening which is surrounded by the adhesive layer. In this case, the methods may further comprise patterning the phase change material layer and the adhesive layer to form an adhesive pattern and a phase change material pattern which are sequentially stacked. Alternatively, the methods may further comprise planarizing the phase change material layer and the adhesive layer until the interlayer insulating layer is exposed. As a result, an adhesive pattern and a phase change material pattern may be formed in the opening.

In yet still other embodiments, a portion of the phase change material pattern adjacent to the adhesive pattern may contain carbon which is diffused out from the adhesive pattern. In some embodiments, the carbon may diffuse throughout the phase change material pattern and, in other embodiments, the carbon may diffuse over only a portion of the phase change material pattern. In still other embodiments, the carbon concentration in the phase change pattern may decrease (for example, linearly or exponentially) as a function of distance from the adhesive pattern.

In further embodiments, the method may further comprise applying an annealing process to the substrate including the adhesive pattern to reduce resistivity of the adhesive pattern.

In yet further embodiments, the method may further comprise forcing an initial program current into the phase change material pattern, the adhesive pattern and the heating electrode in order to reduce resistivity of the adhesive pattern.

DETAILED DESCRIPTION OF PREFERRED EMBODIMENTS

The present invention now will be described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. In the drawings, the size and relative sizes of layers and regions may be exaggerated for clarity. Like numbers refer to like elements throughout.

It will be understood that when an element such as a layer, region or substrate is referred to as being "on" another element, it can be directly on the other element or intervening elements may also be present. In contrast, the term "directly" means that there are no intervening elements. As used herein, the term "and/or" includes any and all combinations of one or more of the associated listed items.

It will be understood that, although the terms first, second, etc. may be used herein to describe various embodiments, elements, components, regions, layers and/or sections, these embodiments, elements, components, regions, layers and/or sections should not be limited by these terms. These terms are only used to distinguish one embodiment, element, component, region, layer or section from another region, layer or section. Thus, a first embodiment, region, layer or section discussed below could be termed a second embodiment, region, layer or section, and, similarly, a second embodiment, region, layer or section could be termed a first embodiment, region, layer or section without departing from the teachings of the present invention.

Spatially relative terms, such as "beneath," "below," "lower," "above," "upper," "top," "bottom" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the present invention. As used herein, the singular forms "a," "an" and "the" are intended to include the plural forms as well, unless the context clearly indicates otherwise. It will be further understood that the terms "comprises," "comprising," "includes," "including," "have" and/or "having" when used in this specification, specify the presence of stated features, integers, steps, operations, elements, and/or components, but do not preclude the presence or addition of one or more other features, integers, steps, operations, elements, components, and/or groups thereof. Moreover, the term "consisting essentially of" when used in the specification, specifies the stated number of features, integers, steps, operations, elements and/or components, and precludes additional features, integers, steps, operations, elements and/or components, except for insubstantial amounts of impurities or other materials that do not materially affect the basic and novel characteristics of the stated features, integers, steps, operations, elements and/or components.

Example embodiments of the present invention are described herein with reference to cross-section illustrations that are schematic illustrations of idealized embodiments (and intermediate structures) of the present invention. As such, variations from the shapes of the illustrations as a result, for example, of manufacturing techniques and/or tolerances, are to be expected. Thus, example embodiments of the present invention should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present invention.

Unless otherwise defined, all terms (including technical and scientific terms) used herein have the same meaning as commonly understood by one of ordinary skill in the art to which the present invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 2:
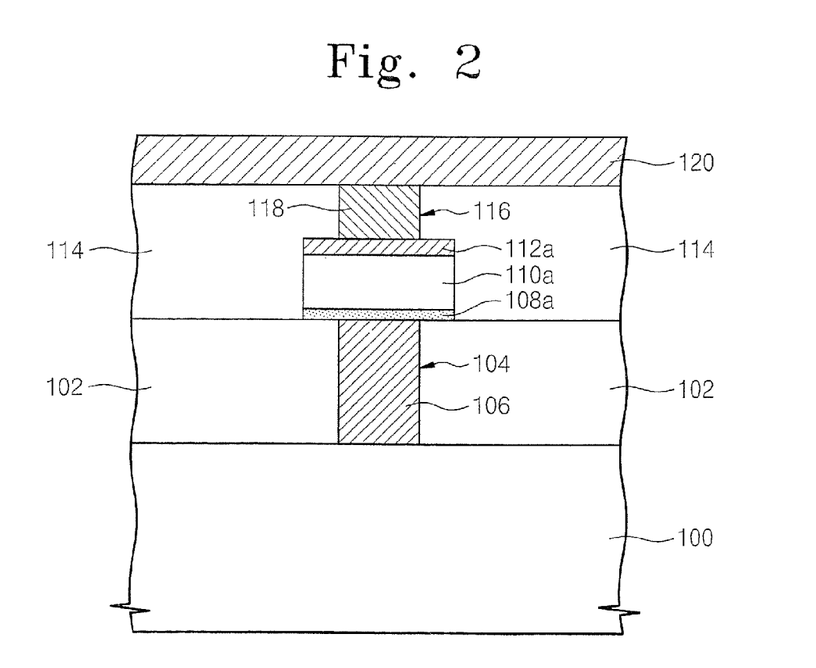
FIG. 2 is a cross sectional view illustrating a phase change memory device according to embodiments of the present invention.

FIG. 2 is a cross sectional view illustrating a phase change memory device according to embodiments of the present invention.

Referring to FIG. 2, a first interlayer insulating layer 102 is disposed on an integrated circuit substrate, such as a semiconductor substrate 100 (hereinafter, referred to as "a substrate"), and a heating electrode 106 is in, and in some embodiments fills, an opening 104 which penetrates the first interlayer insulating layer 102. A top surface of the heating electrode 106 may be substantially coplanar with a top surface of the first interlayer insulating layer 102. A bottom surface of the heating electrode 106 may be electrically connected to a switching element (not shown). For example, the bottom surface of the heating electrode 106 may be connected to a terminal of a metal-oxide-semiconductor (MOS) transistor or a PN diode.

The first interlayer insulating layer 102 may comprise an oxide layer. The heating electrode 106 may comprise conductive metal nitride. For example, the heating electrode 106 may comprise titanium nitride (TiN), tantalum nitride (TaN), molybdenum nitride (MoN), niobium nitride (NbN), titanium silicon nitride (TiSiN), titanium aluminum nitride (TiAlN), titanium boron nitiride (TiBN), zirconium silicon nitride (ZrSiN), tungsten silicon nitride (WSiN), tungsten boron nitride (WBN), zirconium aluminum nitride (ZrAlN), molybdenum silicon nitride (MoSiN), molybdenum aluminum nitride (MoAlN), tantalum silicon nitride (TaSiN), tantalum aluminum nitride (TaAlN), titanium oxynitride (TiON), titanium aluminum oxynitride (TiAlON), tungsten oxynitride (WON) and/or tantalum oxynitride (TaON).

An adhesive pattern 108a, a phase change material pattern 110a and a conductive capping pattern 112a are sequentially stacked on the first interlayer insulating layer 102. In this case, the adhesive pattern 108a may be in direct contact with a top surface of the heating electrode 106. That is, the adhesive pattern 108a may be disposed between the heating electrode 106 and the phase change material pattern 110a, and the adhesive pattern 108a may have a bottom surface and a top surface which directly contact the heating electrode 106 and the phase change material pattern 110a respectively. The adhesive pattern 108a, the phase change material pattern 110a and the conductive capping pattern 112a may have sidewalls which are self-aligned with each other.

The adhesive pattern 108a may comprise carbon. When the adhesive pattern 108a comprises carbon, the adhesive pattern 108a may exhibit excellent properties which have a low thermal sensitivity and a high adhesive strength as compared to the other adhesive pattern without carbon. That is, the adhesive pattern 108a comprising carbon may improve the adhesion between the adhesive pattern 108a and the heating electrode 106 as well as between the adhesive pattern 108a and the phase change material pattern 110a. In other words, the heating electrode 106 and the phase change material pattern 110a may be strongly adhered to each other because of the presence of the adhesive pattern 108a disposed therebetween.

In some embodiments, the adhesive material consists essentially of carbon. In other embodiments, the adhesive material comprises a chemical compound that includes carbon. Thus, the adhesive pattern 108a may comprise carbon and/or carbon nitride (CN). In particular, when the adhesive pattern 108a is formed of carbon, the adhesive pattern 108a may have a resistivity of about $1 \times 10^{-2}$ Ωcm to several Ωcm. In addition, the adhesive pattern 108a may comprise silicon carbide (SiC), silicon carbon nitride (SiCN), titanium carbide (TiC), germanium carbide (GeC), germanium silicon carbide (GeSiC), tantalum carbide (TaC) and/or tungsten carbide (WC).

The phase change material pattern 110a may be a material having two stable states. For example, the phase change material pattern 110a may comprise chalcogenide elements such as tellurium (Te) and/or selenium (Se). In addition, the phase change material pattern 110a may further comprise of germanium (Ge), stibium (Sb), bismuth (Bi), palladium (Pd), stannum (Sn), argentum (Ag), Arsenic (As), sulfur (S), silicon (Si), phosphorus (Ph), oxygen (O) and/or nitrogen (N). For example, the phase change material pattern 110a may be a Ge—Sb—Te layer, a As—Sb—Te layer, a As—Ge—Sb—Te layer, a Sn—Sb—Te layer, a Ag—In—Sb—Te layer, a In—Sb—Te layer, a compound layer of 5A group element, stibium (Sb) and tellurium (Te), a compound layer of 6A group element, stibium (Sb) and tellurium (Te), a compound layer of 5A group element, stibium (Sb) and selenium (Se), and/or a compound layer of 6A group element, stibium (Sb) and selenium (Se).

The carbon contained in the adhesive pattern 108a may be diffused into the phase change material pattern 110a which is adjacent to the adhesive pattern 108a. Thus, a portion of the phase change material pattern 110a, which is adjacent to the adhesive pattern 108a, may also contain carbon. In still other embodiments, a portion of the phase change material pattern remote from the adhesive pattern may be free of carbon. In still other embodiments, a concentration of carbon in the phase change material pattern may decrease (for example, linearly or exponentially) as a function of distance away from the adhesive pattern. Accordingly, the adhesion between the adhesive pattern 108a and the phase change material pattern 110a may be more improved. Moreover, the portion of the phase change material pattern 110a, which is adjacent to a top surface of the heating electrode 106, may correspond to a programmable region. Thus, the programmable region may contain carbons which are diffused out form the adhesive pattern 108a, and the programmable region may be changed into a crystalline state or an amorphous state according to the program condition as described above. When the programmable region contains carbons, the data retention characteristic of the phase change material pattern 110a may be improved. That is, when the programmable region contains carbon, the programmable region of the phase change material pattern 110a may keep its crystallographic structure (an amorphous state or a crystalline state) more stable in a read mode and a standby mode.

The conductive capping pattern 112a may be formed of a conductive material layer on which the phase change material pattern 110a hardly reacts. That is, the conductive capping pattern 112a may comprise a conductive metal nitride layer. For example, the conductive capping pattern 112a may comprise titanium nitride (TiN), tantalum nitride (TaN), molybdenum nitride (MoN), niobium nitride (NbN), titanium silicon nitride (TiSiN), titanium aluminum nitride (TiAlN), titanium boron nitiride (TiBN), zirconium silicon nitride (ZrSiN), tungsten silicon nitride (WSiN), tungsten boron nitride (WBN), zirconium aluminum nitride (ZrAlN), molybdenum silicon nitride (MoSiN), molybdenum aluminum nitride (MoAlN), tantalum silicon nitride (TaSiN), tantalum aluminum nitride (TaAlN), titanium oxynitride (TiON), titanium aluminum oxynitride (TiAlON), tungsten oxynitride (WON) and/or tantalum oxynitride (TaON).

A second interlayer insulating layer 114 is disposed on a surface of the substrate including the conductive capping pattern 112a. The second interlayer insulating layer 114 may comprise an oxide layer. The conductive capping pattern 112a may be in contact with an interconnection plug 118, and in some embodiments filling, a contact hole 116 which penetrates the second interlayer insulating layer 114. An interconnection 120 is disposed on the second interlayer insulating layer 114 to contact the interconnection plug 118. The interconnection plug 118 may comprise a conductive material. For example, the interconnection plug 118 may comprise a tungsten layer. The interconnection 120 may also comprise a conductive material. For example, the interconnection 120 may comprise tungsten, copper and/or aluminum.

According to the aforementioned phase change memory devices, the adhesive pattern 108a may be formed of material containing carbon. Thus, the adhesive pattern 108a containing carbon may reduce the influence of temperature on the phase change memory device. Further, the adhesive pattern 108a containing carbon may improve the adhesion between the heating electrode 106 and the phase change material pattern 110a. As a result, even though a program operation is repeatedly performed on the phase change memory device, the phase change memory device may exhibit an excellent endurance characteristic.

A first sample and a second sample were fabricated to compare the endurance characteristic of the conventional phase change memory device with that of the phase change memory device shown in FIG. 2. The first sample corresponded to the conventional phase change memory device, and the second sample corresponded to a phase change memory device according to embodiments of the present invention. The heating electrode and the phase change material pattern of the first sample were formed of a titanium nitride (TiN) layer and a GST layer respectively. Also, the first sample was fabricated to have the heating electrode and the phase change material pattern directly contacting each other without formation of the adhesive pattern.

In contrast, the second sample was fabricated to have the adhesive pattern intervened between the heating electrode and the phase change material pattern which were formed of a TiN layer and a GST layer respectively, and the adhesive pattern was formed using a carbon gas.

Endurance tests were performed on the first and second samples. The endurance tests were achieved by repeatedly and alternately performing a first program operation for changing the phase change material pattern into an amorphous state and a second program operation for changing the phase change material pattern into a crystalline state. Further, a first electrical resistance (e.g., a reset resistance) of the phase change material pattern having the amorphous state and a second electrical resistance (e.g., a set resistance) of the phase change material pattern having the crystalline state were measured every cycle of the program operation.

When the number of the cycles of the program operation reached about $1 \times 10^7$, the reset resistance of the phase change material pattern of the first sample began to decrease. Without wishing to be bound by any theory of operation, it appeared that the phase change material pattern began to partially lift off from the heating electrode. In this case, the joule heat generated from the heating electrode may not be fully conducted to the phase change material pattern. Thus, even though the first program operation is performed to change the phase change material pattern into an amorphous state, a portion of the phase change material pattern may maintain the previous crystalline state. As a result, the reset resistance of the phase change material pattern of the conventional phase change memory device may begin to decrease as the number of cycles of the program operation increases. However, when the number of the cycles of the program operation reached about $1 \times 10^8$, both the set resistance and the reset resistance of the phase change material pattern of the conventional phase change memory device began to abruptly increase toward the same high resistance value. It appeared that the phase change material pattern was completely lifted off from the heating electrode. In this case, even though the first and second program operations are performed to change the phase change material pattern into an amorphous state or a crystalline state, current may not flow through the heating electrode and the phase change material pattern because of the presence of an air gap between the heating electrode and the phase change material pattern. Accordingly, both the set resistance and reset resistance may exhibit the same high resistance which is greater than an initial reset resistance of the conventional phase change material pattern.

In contrast, even when the number of the cycles of the program operation reached about $1 \times 10^9$, both the set resistance and the reset resistance of the phase change material pattern of the second sample substantially still maintained the initial set resistance and the initial reset resistance. As a result, the phase change memory device according to the present invention may exhibit an improved endurance characteristic as compared to the conventional phase change memory device.

Next, methods of fabricating phase change memory devices according to embodiments the present invention will be described with reference to FIGS. 3 and 4.

Figure 3:
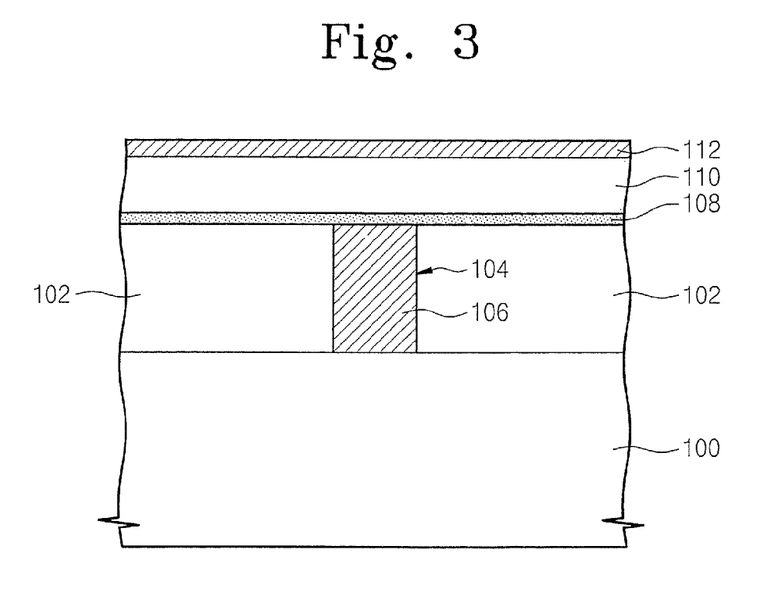
FIGS. 3 and 4 are cross sectional views illustrating methods of fabricating phase change memory devices according to embodiments of the present invention.

Referring to FIG. 3, a first interlayer insulating layer 102 is formed on an integrated circuit substrate 100, for example, a semiconductor substrate. The first interlayer insulating layer 102 is patterned to form an opening 104 which penetrates the first interlayer insulating layer 102. A conductive layer in, and in some embodiments filling, the opening 104 may be formed on the first interlayer insulating layer 102, and the conductive layer may be planarized until the first interlayer insulating layer 102 is exposed. As a result, a heating electrode 106 may be formed in the opening 104, and a top surface of the heating electrode 106 may be substantially coplanar with a top surface of the first interlayer insulating layer 102.

An adhesive layer 108, a phase change material layer 110 and a conductive capping layer 112 may be sequentially formed on the substrate including the heating electrode 106. The adhesive layer 108 may be formed to be in direct contact with the top surface of the heating electrode 106. The adhesive layer 108 may be formed of a carbon containing material layer. The adhesive layer 108 may be formed using a spin coating technique, a chemical vapor deposition (CVD) technique or a sputtering technique. An annealing process may be applied to the substrate after deposition of the adhesive layer 108. Alternatively, the annealing process may be performed after deposition of the adhesive layer 108 and/or formation of other layers. For example, the annealing process may be performed after formation of the conductive capping layer 112. The annealing process may reduce the resistivity of the adhesive layer 108. A process temperature of the annealing process may depend on the deposition method of the adhesive layer 108.

Figure 4:
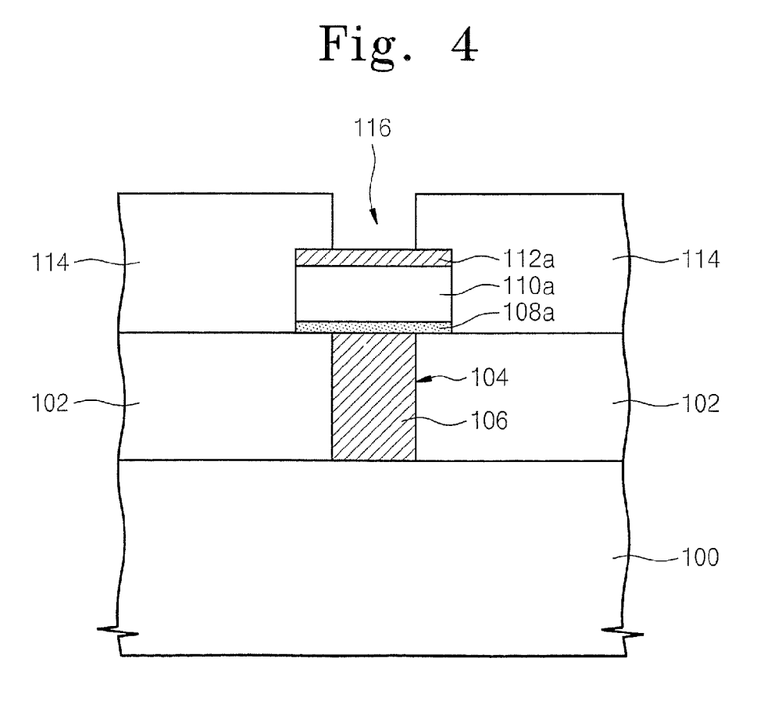

Referring to FIG. 4, the conductive capping layer 112, the phase change material layer 110 and the adhesive layer 108 are patterned to form an adhesive pattern 108a, a phase change material pattern 110a and a conductive capping pattern 112a which are sequentially stacked on the first interlayer insulating layer 102. The adhesive pattern 108a may be formed to be in direct contact with the top surface of the heating electrode 106.

A second interlayer insulating layer 114 may be formed on the substrate including the conductive capping pattern 112a, and the second interlayer insulating layer 114 is patterned to form a contact hole 116 which exposes the conductive capping pattern 112a.

Although not shown in FIG. 4, an interconnection plug (118 of FIG. 2) may be formed in or fill the contact hole 116, and an interconnection (120 of FIG. 2) may be formed on the second interlayer insulating layer 114. Accordingly, the phase change memory device shown in FIG. 2 may be fabricated.

In other embodiments, the annealing process for reducing the resistivity of the adhesive layer 108 may be omitted. In this case, the resistivity of the adhesive pattern 108a may be reduced by forcing an initial program current into the unit cell of the phase change memory device after fabrication of the phase change memory device. That is, the initial program current may generate joule heat at an interface between the heating electrode 106 and the adhesive pattern 108a, and the joule heat may reduce the resistivity of the adhesive pattern 108a. Annealing and current forcing may both be used in other embodiments.

Figure 5:
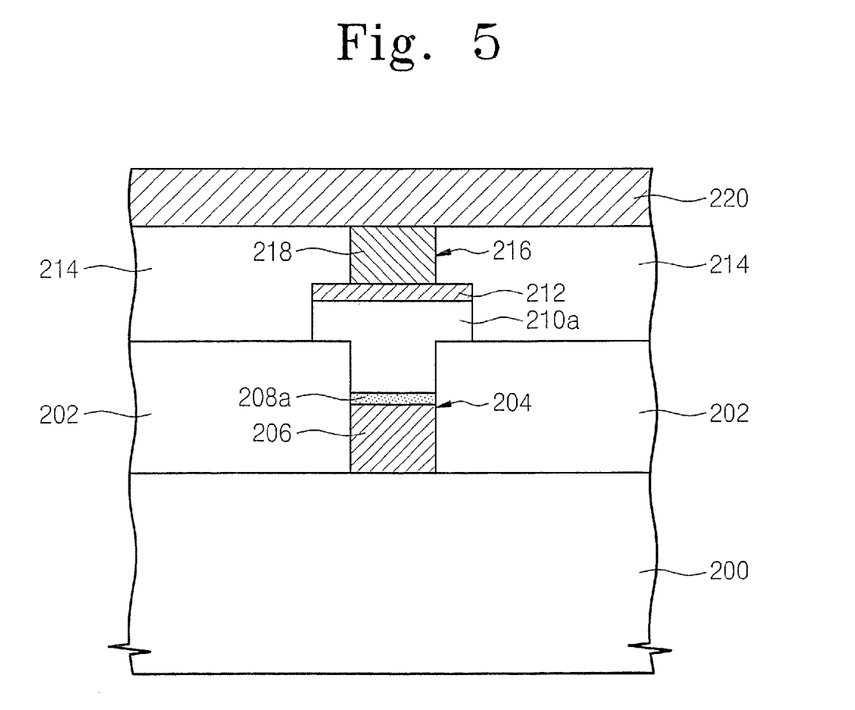
FIG. 5 is a cross sectional view illustrating a phase change memory device according to other embodiments of the present invention.

FIG. 5 is a cross sectional view illustrating a phase change memory device according to other embodiments of the present invention.

Referring to FIG. 5, a first interlayer insulating layer 202 is disposed on an integrated circuit substrate 200, for example, a semiconductor substrate. A heating electrode 206 is in, and in some embodiments fills, a lower portion of an opening 204 which penetrates the first interlayer insulating layer 202. That is, a top surface of the heating electrode 206 may be lower than that of the first interlayer insulating layer 202. A bottom surface of the heating electrode 206 may be electrically connected to a terminal of a switching element (not shown). For example, the bottom surface of the heating electrode 206 may be connected to a terminal of a metal-oxide-semiconductor (MOS) transistor or a PN diode.

An adhesive pattern 208a is disposed on the heating electrode 206. The adhesive pattern 208a may be in direct contact with the top surface of the heating electrode 206 and may be disposed in the opening 204. A top surface of the adhesive pattern 208a may be lower than that of the first interlayer insulating layer 202. A planar area of the adhesive pattern 208a may be substantially equal to that of the top surface of the heating electrode 206.

An upper portion of the opening 204 is filled at least partially with a phase change material pattern 210a. In other words, the heating electrode 206 and the phase change material pattern 210a may be in, and in some embodiments may fill, the lower portion and the upper portion of the opening 204 respectively, and the adhesive pattern 208a may be disposed between the heating electrode 206 and the phase change material pattern 210a. That is, the bottom surface and the top surface of the adhesive pattern 208a may directly contact the heating electrode 206 and the phase change material pattern 210a, respectively. The phase change material pattern 210a may have a top surface which is higher than the top surface of the first interlayer insulating layer 202. Further, the phase change material pattern 210a may extend onto the first interlayer insulating layer 202, thereby covering a portion of the top surface of the first interlayer insulating layer 202 which is adjacent to the opening 204. As a result, a lower portion of the phase change material pattern 210a may be in, and some embodiments may fill, the upper portion of the opening 204, and an upper portion of the phase change material pattern 210a may be disposed on a portion of the top surface of the first interlayer insulating layer 202.

The adhesive pattern 208a may be the same material pattern as the adhesive pattern 108a which is described with reference to FIG. 2. That is, the adhesive pattern 208a may also contain carbon. Thus, the heating electrode 206, the adhesive pattern 208a and the phase change material pattern 210a may be strongly adhered to each other to obtain the same effects as the embodiment illustrated in FIG. 2.

In addition, the lower portion of the phase change material pattern 210a is in, and some embodiments fills, the upper portion of the opening 204, as described above. Accordingly, a programmable region of the phase change material pattern 210a may be defined in the opening to be adjacent to the heating electrode 206. That is, the phase change material pattern 210a may have a confined shape. As a result, when a program current is forced into the phase change memory cell to generate joule heat from the heating electrode 206 in a program mode, the joule heat may be efficiently conducted to the programmable region of the phase change material pattern 210a in the opening 204 to reduce or minimize heat dissipation. The reduction/minimization of the heat dissipation may lead to reduction of power consumption of the phase change memory device.

The heating electrode 206 may be the same material as the heating electrode 106 which is described with reference to FIG. 2. Further, the phase change material pattern 210a may be the same material as the phase change material pattern 110a which is described with reference to FIG. 2. In addition, a portion of the phase change material pattern 210a adjacent to the adhesive pattern 208a may also contain carbon which are diffused out from the adhesive pattern 208a. The carbon concentration may decrease linearly or exponentially with distance from the adhesive pattern 208a based on this diffusion.

A conductive capping pattern 212 may be disposed on the phase change material pattern 210a. The conductive capping pattern 212 may be self-aligned with the phase change material pattern 210a. The conductive capping pattern 212 may be the same material as the conductive capping pattern 112a which is described with reference to FIG. 2.

A second interlayer insulating layer 214 disposed on the conductive capping pattern 212, the phase change material pattern 210a and the first interlayer insulating layer 202. An interconnection plug 218 may by in, and in some embodiments may fill, a contact hole 216 which penetrates the second interlayer insulating layer 214 to expose the conductive capping pattern 212. An interconnection 220 is disposed on the second interlayer insulating layer 214 to contact the interconnection plug 218. The interconnection plug 218 and the interconnection 220 may be the same material as the interconnection plug 118 and the interconnection 120 which is described with reference to FIG. 2. The second interlayer insulating layer 214 may be an oxide layer, for example, a silicon oxide layer. Alternatively, the second interlayer insulating layer 214 may be an insulating layer having a thermal conductivity which is lower than that of the silicon oxide layer.

According to the phase change memory devices described above, the adhesive pattern 208a containing carbon is disposed between the heating electrode 206 and the phase change material pattern 210a. Thus, adhesion between the heating electrode 206 and the phase change material pattern 210a may be improved due to the presence of the adhesive pattern 208a disposed therebetween. As a result, the endurance characteristic of the phase change memory device may be significantly enhanced. Further, a portion of the phase change material pattern 210a adjacent to the adhesive pattern 208a may also contain carbon and act as a programmable region, thereby enhancing the data retention characteristic of the phase change memory device.

In addition, the phase change material pattern 210a may have a confined shape. That is, the programmable region of the phase change material pattern 210a may be located in the opening 204 to contact the heating electrode 206 filling a lower portion of the opening 204. Thus, the heat dissipation may be reduced or minimized during a program mode, thereby significantly reducing the power consumption of the phase change memory device.

Figure 6:
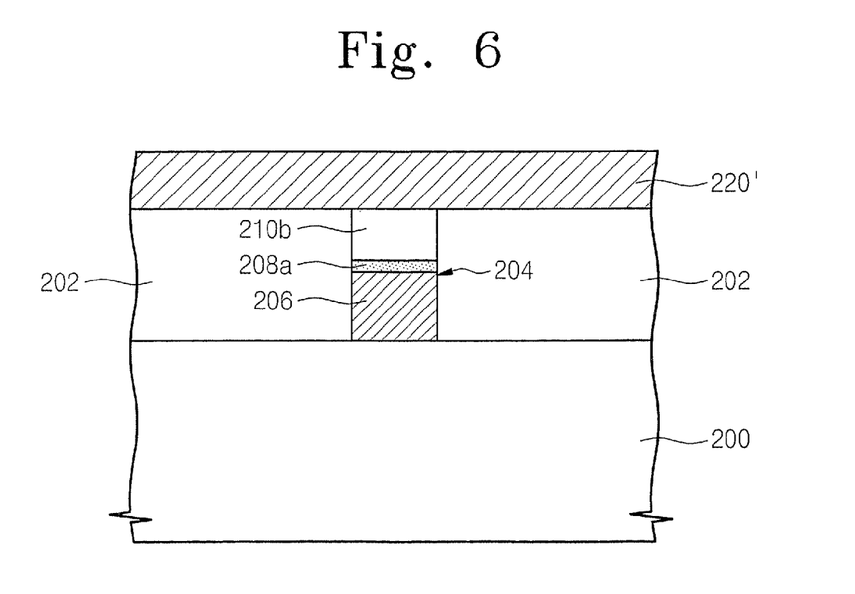
FIG. 6 is a cross sectional view illustrating modified embodiments of a phase change memory device shown in FIG. 5.

The phase change material pattern 210a may be modified in many different forms. One of the modified embodiments is illustrated in FIG. 6. That is, the modified embodiment shown in FIG. 6 may be similar to the embodiment shown in FIG. 5. Thus, like elements are indicated using like reference numbers in FIGS. 5 and 6.

Referring to FIG. 6, the heating electrode 206 is in or fills the lower portion of the opening 204 which penetrates the first interlayer insulating layer 202, as described with reference to FIG. 5. The upper portion of the opening 204 may include or be filled with a phase change material pattern 210b. In addition, the adhesive pattern 208a may be disposed between the heating electrode 206 and the phase change material pattern 210b, as described with reference to FIG. 5. Accordingly, the adhesive pattern 208a may also be disposed in the opening 204.

The phase change material pattern 210b may have a top surface which is substantially coplanar with that of the first interlayer insulating layer 202, unlike the embodiments illustrated in FIG. 5. That is, the phase change material pattern 210b may be completely confined in the upper portion of the opening 204. The phase change material pattern 210b may be the same material pattern as the phase change material pattern 210a illustrated in FIG. 5. Moreover, a portion of the phase change material pattern 210b adjacent to the adhesive pattern 208a may also contain carbon. The carbon concentration may decrease linearly or exponentially with distance from the adhesive pattern 208a based on this diffusion. Thus, the data retention characteristic of the phase change material pattern 210b may also be improved.

An interconnection 220' may be disposed on the first interlayer insulating layer 202 to contact the top surface of the phase change material pattern 210b. In particular, the interconnection 220' may be in direct contact with the entire top surface of the phase change material pattern 210b. The interconnection 220' may be formed of the same material layer as the interconnection 220 illustrated in FIG. 5.

In the phase change memory devices described above, the phase change material pattern 210b is confined only in the opening 204. Thus, when a program current is forced into the phase change memory cell to generate joule heat from the heating electrode 206 during a program mode, the heat dissipation may be reduced or minimized to reduce the power consumption of the phase change memory device. Further, the integration density of the phase change memory device may increase since the planar area which the phase change material pattern 210b occupies is reduced. In addition, the phase change memory device shown in FIG. 6 may not require the conductive capping pattern 212, the second interlayer insulating layer 214 and/or the interconnection plug 218 which are illustrated in FIG. 5. Accordingly, a number of processes for fabricating the phase change memory device may be omitted to enhance the throughput thereof.

Now, methods of fabricating phase change memory devices of FIG. 5 will be described with reference to FIGS. 7 to 10.

Figure 7:
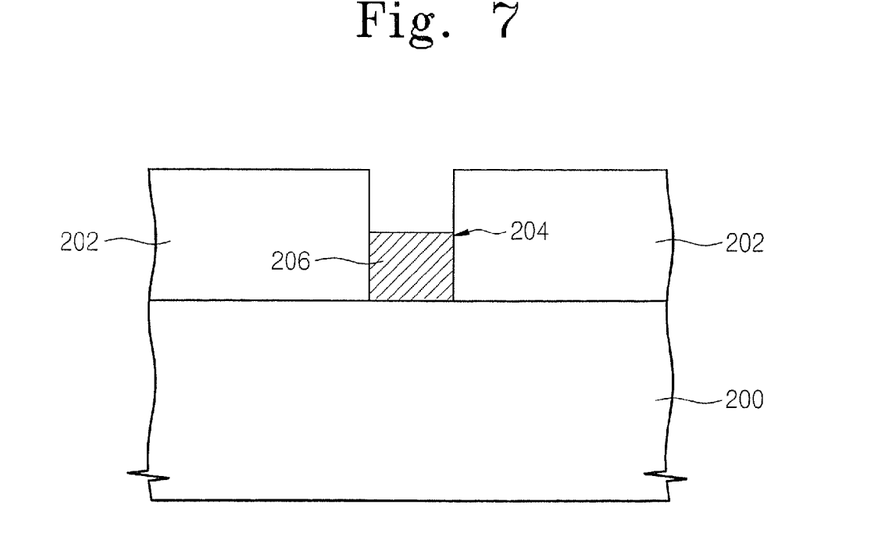
FIGS. 7 to 10 are cross sectional views illustrating methods of fabricating phase change memory devices shown in FIG. 5.

Referring to FIG. 7, a first interlayer insulating layer 202 is formed on an integrated circuit substrate 200, for example, a semiconductor substrate. The first interlayer insulating layer 202 may be patterned to form an opening 204 which penetrates the first interlayer insulating layer 202. A conductive layer is formed on the first interlayer insulating layer 202 and in the opening 204. The conductive layer may be then planarized until the first interlayer insulating layer 202, and the planarized conductive layer may be recessed to form a heating electrode 206 which remains in a lower portion of the opening 204. As a result, an upper portion of the opening 204 may still maintain an empty space.

Figure 8:
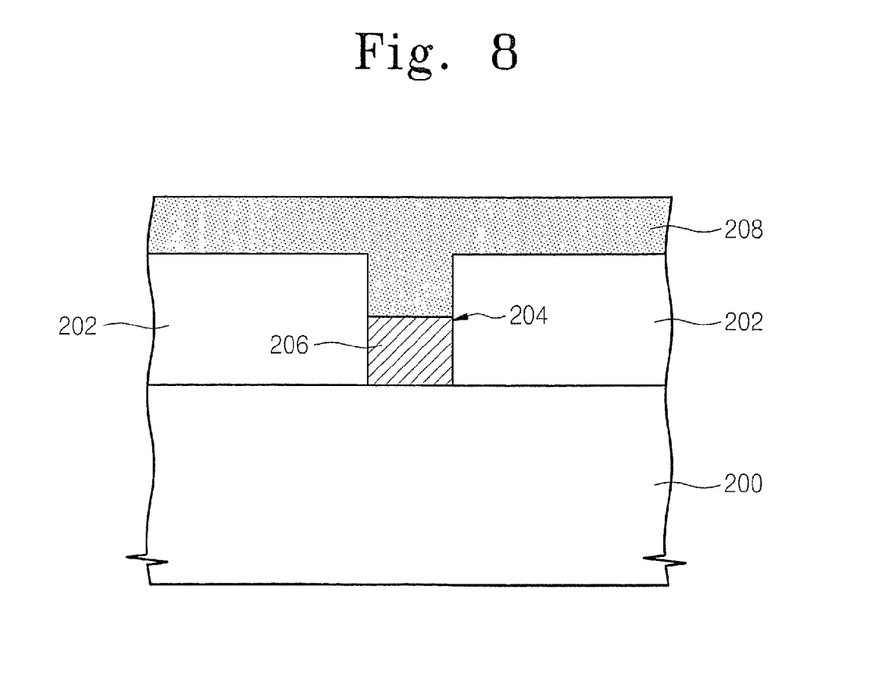

Referring to FIG. 8, an adhesive layer 208 may be formed on the first interlayer insulating layer 202 and in the upper portion of the opening 204. The adhesive layer 208 may be formed of a carbon containing material layer. The adhesive layer 208 may be deposited using a spin coating technique, a chemical vapor deposition (CVD) technique and/or a sputtering technique. An annealing process may be applied to the substrate after deposition of the adhesive layer 208 in order to reduce the resistivity of the adhesive layer 208. Alternatively, the annealing process may be performed after deposition of the adhesive layer 208 and formation of other layers or patterns. A process temperature of the annealing process may depend on the deposition method of the adhesive layer 208.

Figure 9:
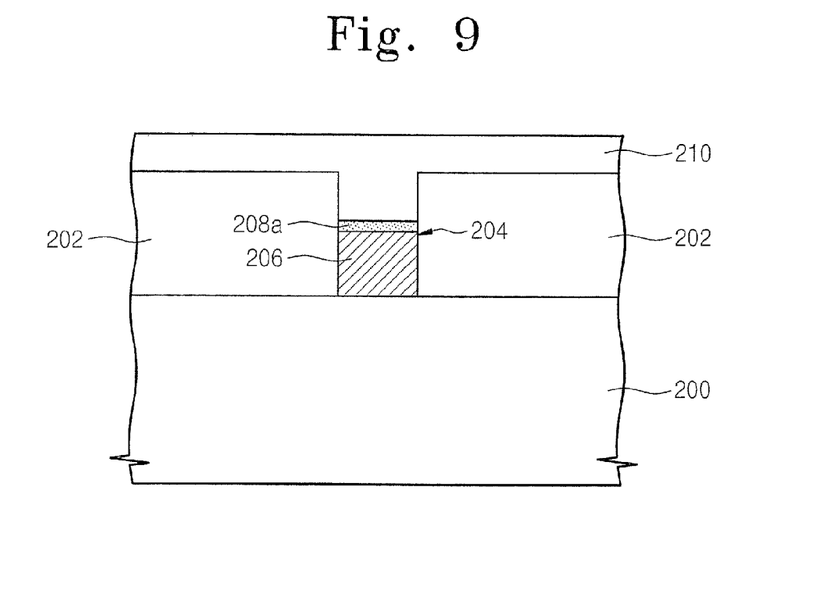

Referring to FIG. 9, the adhesive layer 208 may be planarized until the first interlayer insulating layer 202 is exposed, and the planarized adhesive layer may be then recessed to form an adhesive pattern 208a on the heating electrode 206. The adhesive pattern 208a may be formed to have a top surface which is lower than that of the first interlayer insulating layer 202. Thus, the upper portion of the opening 204 may still be empty. A phase change material layer 210 may be then formed on the first interlayer insulating layer 202 and in the upper portion of the opening 204.

Figure 10:
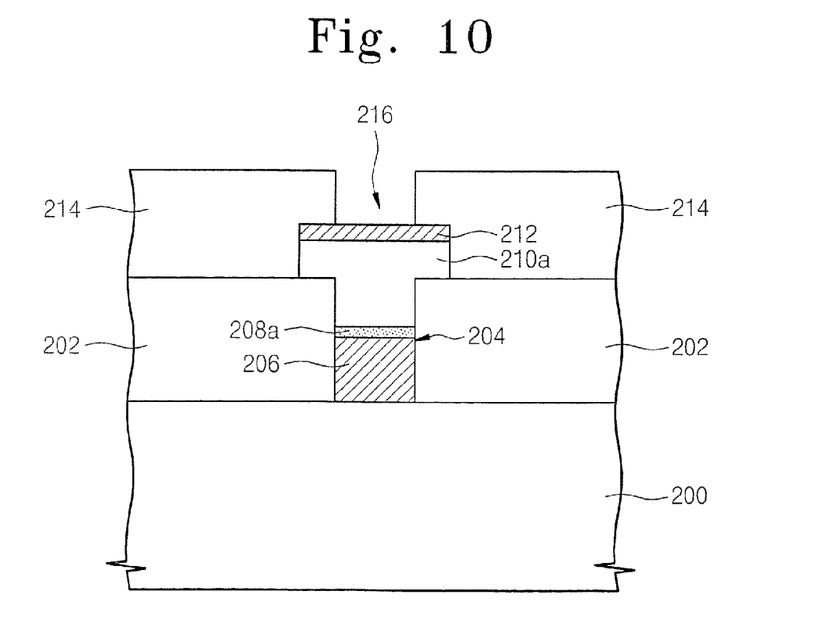

Referring to FIG. 10, a conductive capping layer may be formed on the phase change material layer 210, and the conductive capping layer and the phase change material layer 210 are successively patterned to form a phase change material pattern 210a and a conductive capping pattern 212 which are sequentially stacked. In this case, the phase change material pattern 210a may be formed so that a lower portion of the phase change material pattern 210a is in or fills the upper portion of the opening 204 and an upper portion of the phase change material pattern 210a covers the first interlayer insulating layer 202 outside the opening 204.

A second interlayer insulating layer 214 may be formed on the first interlayer insulating layer 202, the phase change material pattern 210a and the conductive capping pattern 212. The second interlayer insulating layer 214 may be patterned to form a contact hole 216 which exposes the conductive capping pattern 212.

Although not shown in FIG. 10, an interconnection plug (218 of FIG. 5) may be formed in the contact hole 216, and an interconnection (220 of FIG. 5) may be formed on the second interlayer insulating layer 214. Thus, the phase change memory device shown in FIG. 5 may be fabricated.

In other embodiments, the annealing process for reducing the resistivity of the adhesive layer 208 may be omitted. In this case, the resistivity of the adhesive pattern 208a may be reduced by forcing an initial program current into the unit cell of the phase change memory device after fabrication of the phase change memory device. That is, the initial program current may generate joule heat at an interface between the heating electrode 206 and the adhesive pattern 208a, and the joule heat may reduce the resistivity of the adhesive pattern 208a.

Now, methods of fabricating phase change memory devices of FIG. 6 will be described with reference to FIG. 11. The methods may include the explanations described with reference to FIGS. 7 to 9.

Figure 11:
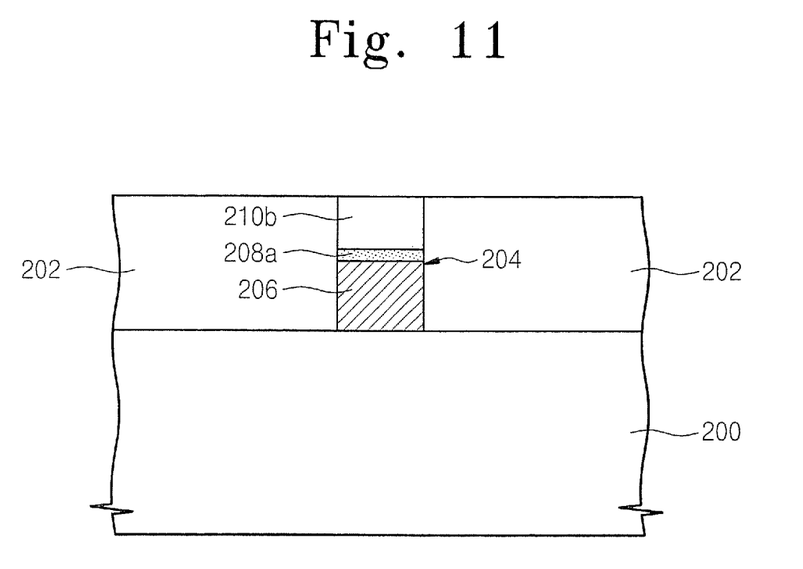
FIG. 11 is a cross sectional view illustrating methods of fabricating phase change memory devices shown in FIG. 6.

Referring to FIG. 11, a first insulating layer 202, an opening 204, a heating electrode 206, an adhesive pattern 208a and a phase change material layer 210 may be formed using the same manner as the embodiments described with reference to FIGS. 7 to 9. The phase change material layer 210 may be then planarized until the first insulating layer 202 is exposed. As a result, a phase change material pattern 210b may be formed in the opening 204 which is located on the adhesive pattern 208a.

Although not shown in FIG. 11, an interconnection (220' of FIG. 6) may be formed on the first insulating layer 202 to contact the phase change material pattern 210b which is confined in the opening 204. Accordingly, the phase change memory device shown in FIG. 6 may be fabricated.

Figure 12:
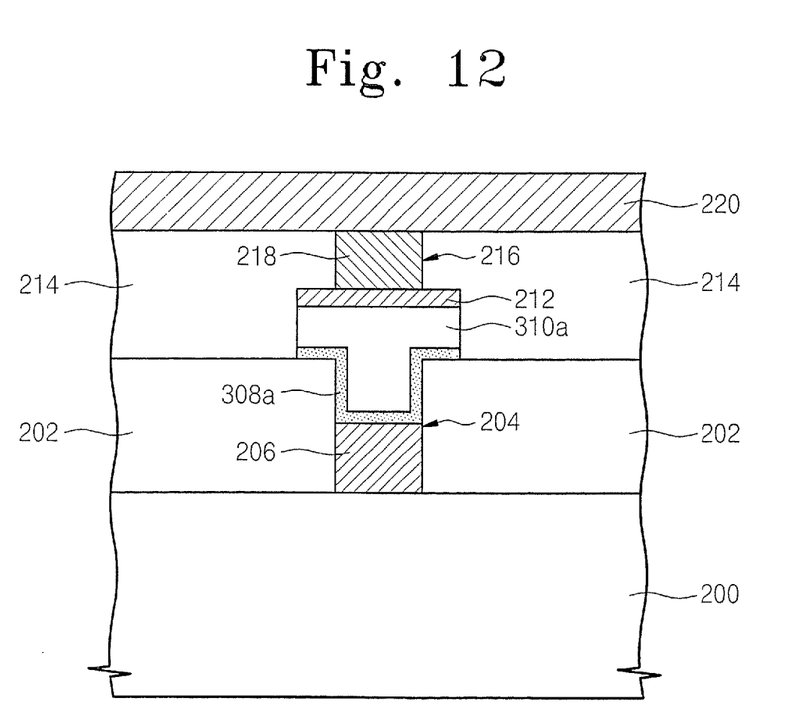
FIG. 12 is a cross sectional view illustrating a phase change memory device according to still other embodiments of the present invention.

FIG. 12 is a cross sectional view illustrating a phase change memory device according to still other embodiments of the present invention. The present embodiments are different from embodiments illustrated in FIG. 5 in terms of an adhesive pattern and a phase change material pattern. Accordingly, the descriptions to the adhesive pattern and the phase change material pattern will be developed in detail, and like elements are indicated using like reference numbers in FIGS. 5 and 12.

Referring to FIG. 12, a first interlayer insulating layer 202 is disposed on an integrated circuit substrate 200, for example, a semiconductor substrate. A heating electrode 206 may be disposed in an opening 204 which penetrates the first interlayer insulating layer 202. The heating electrode 206 may be in or fill a lower portion of the opening 204. That is, the heating electrode 206 may have a top surface which is lower than that of the first interlayer insulating layer 202.

A phase change material pattern 310a may be disposed on the heating electrode 206. A lower portion of the phase change material pattern 310a may be in or fill an upper potion of the opening 204, and an upper portion of the phase change material pattern 310a may extend onto the first insulating layer 202 outside the opening 204 to cover a portion of a top surface of the first insulating layer 202. That is, the phase change material pattern 310a may have a top surface which is higher than that of the first insulating layer 202. The phase change material pattern 310a may be the same material pattern as the phase change material pattern 110a of the embodiments described with reference to FIG. 2.

An adhesive pattern 308a may be disposed between the top surface of the heating electrode 206 and the bottom surface of the phase change material pattern 310a in the opening 204. Further, the adhesive pattern 308a may extend along an interface between the phase change material pattern 310a and the first interlayer insulating layer 202. Thus, the adhesive pattern 308a may be disposed between the phase change material pattern 310a and the first interlayer insulating layer 202. That is, the adhesive pattern 308a may be disposed between a sidewall of the lower portion of the phase change material pattern 310a and a sidewall of the opening 204 as well as between a bottom surface of the upper portion of the phase change material pattern 310a and a top surface of the first interlayer insulating layer 202 outside of the opening 204. The adhesive pattern 308a may directly contact the top surface of the heating electrode 206 and surround the lower portion of the phase change material pattern 310a. Moreover, the adhesive pattern 308a may directly contact a bottom surface of the upper portion of the phase change material pattern 310a.

The adhesive pattern 308a may be the same material pattern as the adhesive patterns 108a and 208a illustrated in the first and second embodiments. That is, the adhesive pattern 308a may be a carbon containing material pattern. Thus, the heating electrode 206 and the phase change material pattern 310a may be strongly adhered to each other because of the presence of the adhesive pattern 308a disposed therebetween. As a result, the endurance characteristic of the phase change memory device may be enhanced.

The phase change material pattern 310a may be the same material pattern as the phase change material pattern 110a illustrated in the first embodiment. Further, a portion of the phase change material pattern 310a adjacent to the adhesive pattern 308a may also contain carbon which is diffused out from the adhesive pattern 308a and act as a programmable region. Thus, the data retention characteristic of the phase change memory device may be enhanced.

In addition, the lower portion of the phase change material pattern 310a is confined in the opening 204, and the programmable region of the phase change material pattern 310a may be located in the opening 204. Thus, when a program current is forced into the phase change memory cell to generate joule heat from the heating electrode 206 during a program mode, the heat dissipation may be reduced or minimized to reduce the power consumption of the phase change memory device.

A conductive capping pattern 212 may be disposed on the phase change material pattern 310a, and a second interlayer insulating layer 214 may be disposed to cover the conductive capping pattern 212. The conductive capping pattern 212 may be in contact with an interconnection plug 218 filling a contact hole 216 which penetrates the second interlayer insulating layer 214, and the interconnection plug 218 may be electrically connected to an interconnection 220 which is disposed on the second interlayer insulating layer 214.

Figure 13:
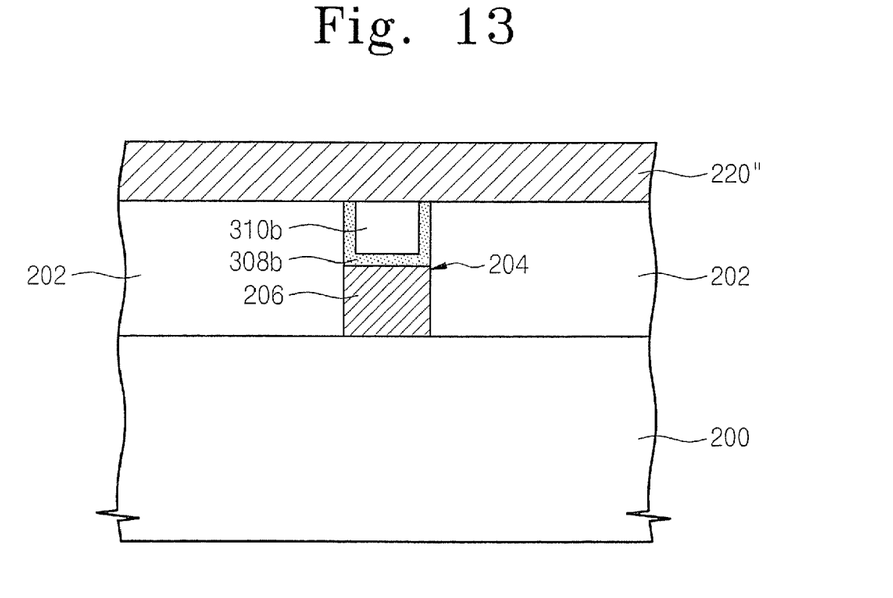
FIG. 13 is a cross sectional view illustrating modified embodiments of a phase change memory device shown in FIG. 12.

FIG. 13 is a cross sectional view illustrating modified embodiments of a phase change memory device shown in FIG. 12.

Referring to FIG. 13, the heating electrode 206 is in or fills the lower portion of the opening 204 which penetrates the first interlayer insulating layer 202, as described with reference to FIG. 12. The upper portion of the opening 204 may include or be filled with a phase change material pattern 310b. In the present modified embodiments, the phase change material pattern 310b may have a top surface which is substantially coplanar with that of the first interlayer insulating layer 202. That is, the phase change material pattern 310b may be fully confined in the upper portion of the opening 204.

An adhesive pattern 308b may be disposed between a top surface of the heating electrode 206 and a bottom surface of the phase change material pattern 310b. Further, the adhesive pattern 308b may extend along an interface between the phase change material pattern 310b and the first interlayer insulating layer 202. Thus, the adhesive pattern 308b may be disposed between a sidewall of the phase change material pattern 310b and a sidewall of the opening 204. The extension of the adhesive pattern 308b may also have a top surface which is substantially coplanar with that of the first interlayer insulating layer 202. The adhesive pattern 308b may contact the top surface of the heating electrode 206 as well as the bottom surface and the sidewall of the phase change material pattern 310b.

The adhesive pattern 308b may be the same material pattern as the adhesive pattern 108a described in the first embodiment. That is, the adhesive pattern 308b may also contain carbon. Thus, the endurance characteristic of the phase change memory device may be enhanced. Further, the phase change material pattern 310b may be fully confined in the opening 204. Accordingly, the throughput and the integration density of the phase change memory device may also be increased.

The phase change material pattern 310b may be the same material pattern as the phase change material pattern 110a described in other embodiments. In addition, a portion of the phase change material pattern 310b adjacent to the adhesive pattern 308b may contain carbons. As a result, the data retention characteristic of the phase change material pattern 310b may also be enhanced.

An interconnection 220" may be disposed on the first interlayer insulating layer 202 to contact the phase change material pattern 310b. The interconnection 220" may cover the top surface of the phase change material pattern 310b. Furthermore, the interconnection 220" may cover the extension of the adhesive pattern 308b. The interconnection 220" may be the same material pattern as the interconnection 120 illustrated in the earlier embodiments.

Now, methods of fabricating phase change memory devices of FIG. 12 will be described with reference to FIGS. 14 to 15.

Figure 14:
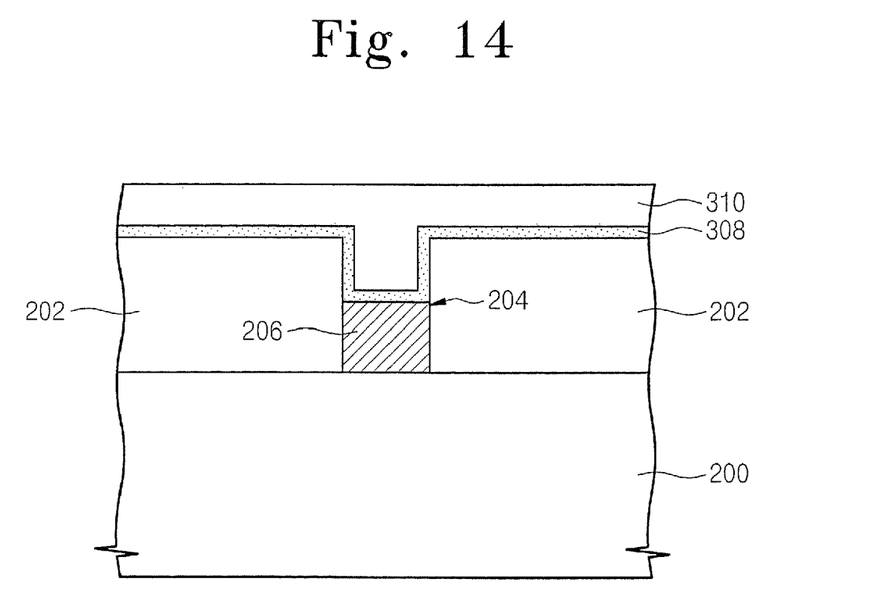
FIGS. 14 and 15 are cross sectional views illustrating methods of fabricating phase change memory devices shown in FIG. 12.

Referring to FIG. 14, a first interlayer insulating layer 202 is formed on a substrate 200, for example, a semiconductor substrate. The first interlayer insulating layer 202 is patterned to form an opening 204 which penetrates the first interlayer insulating layer 202. A heating electrode 206 may be formed in or to fill a lower portion of the opening 204.

An adhesive layer 308 may be conformably formed on the substrate including the heating electrode 206. That is, the adhesive layer 308 may be formed to have the same surface profile as that of the substrate including the heating electrode 206. The adhesive layer 308 may be deposited using a spin coating technique, a chemical vapor deposition technique and/or a sputtering technique. An annealing process may be applied to the substrate after deposition of the adhesive layer 308 in order to reduce the resistivity of the adhesive layer 308. A phase change material layer 310 may be then formed on the adhesive layer 308. The phase change material layer 310 may be formed in or to fill the opening 204 which is surrounded by the adhesive layer 308.

Figure 15:
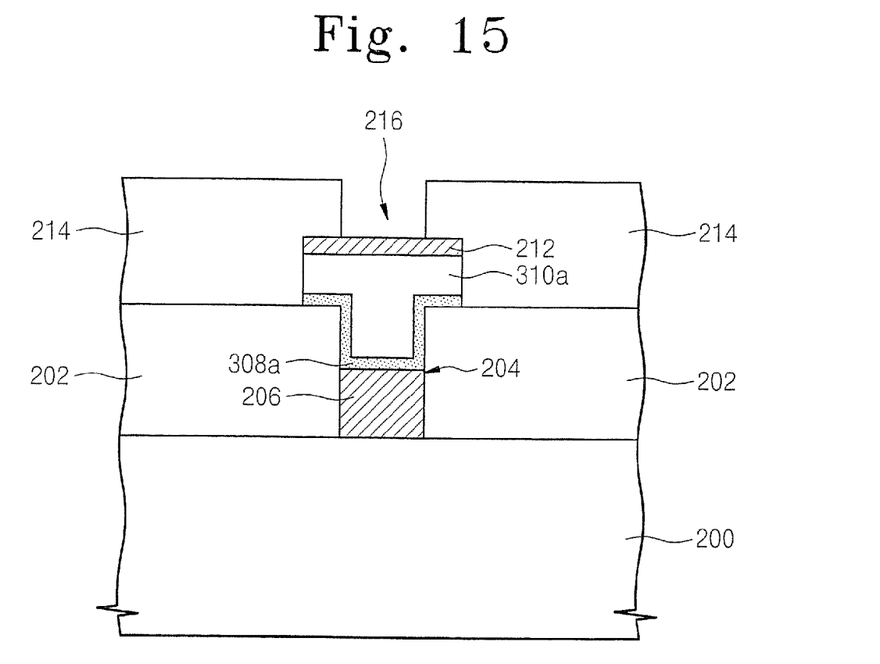

Referring to FIG. 15, a conductive capping layer may be formed on the phase change material layer 310. The conductive capping layer, the phase change material layer 310 and the adhesive layer 308 may be successively patterned to form an adhesive pattern 308a, a phase change material pattern 310a and a conductive capping pattern 212 which are sequentially stacked. A second interlayer insulating layer 214 may be formed on the substrate including the conductive capping pattern 212, and the second interlayer insulating layer may be patterned to form a contact hole 216 which exposes the conductive capping pattern 212.

In other embodiments, the annealing process may be performed after deposition of the adhesive layer 308 and formation of other layers or patterns on the adhesive layer 308. For example, the annealing process may be performed after formation of the conductive capping layer or the second interlayer insulating layer 214. A process temperature of the annealing process may depend on the deposition method of the adhesive layer 308.

An interconnection plug 218 may be formed in the contact hole 216, and an interconnection 220 may be formed on the second interlayer insulating layer 214.

In still other embodiments, the annealing process for reducing the resistivity of the adhesive layer 308 or the adhesive pattern 308a may be omitted. In this case, the resistivity of the adhesive pattern 308a may be reduced by forcing an initial program current into the unit cell of the phase change memory device after fabrication of the phase change memory device. That is, the initial program current may generate joule heat at an interface between the heating electrode 206 and the adhesive pattern 308a, and the joule heat may reduce the resistivity of the adhesive pattern 308a. Annealing and current forcing may both be used in other embodiments.

Now, methods of fabricating phase change memory devices of FIG. 13 will be described with reference to FIG. 16. The methods may include the explanations described with reference to FIG. 14.

Figure 16:
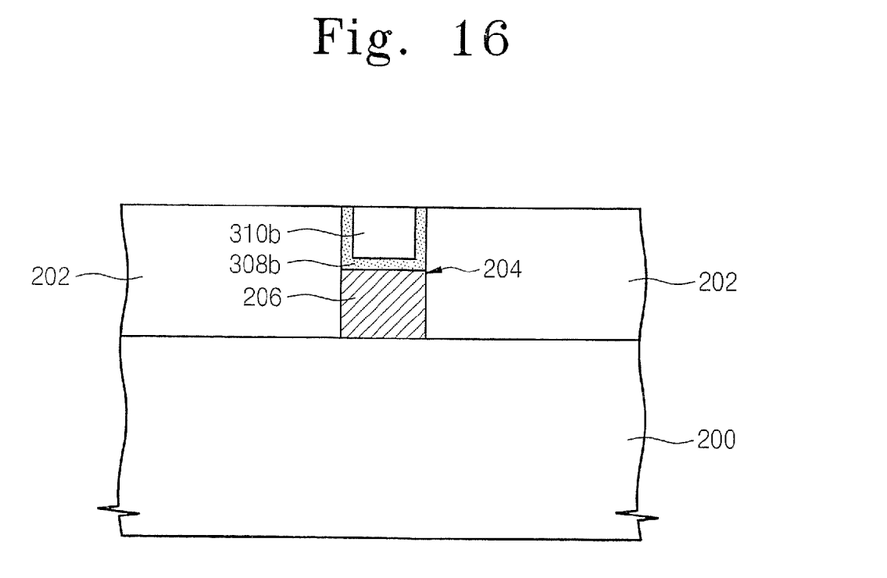
FIG. 16 is a cross sectional view illustrating methods of fabricating phase change memory devices shown in FIG. 13.

Referring to FIGS. 14 and 16, a first interlayer insulating layer 202, an opening 204, a heating electrode 206, an adhesive layer 308 and a phase change material layer 310 may be formed in the same manner as the embodiments described with reference to FIG. 14. The phase change material layer 310 and the adhesive layer 308 may be planarized until a top surface of the first insulating layer 202 is exposed. As a result, an adhesive pattern 308b and a phase change material pattern 310b are formed in an upper portion of the opening 204. The adhesive pattern 308b may be formed to surround a sidewall and a bottom surface of the phase change material pattern 310b. Although not shown in FIG. 16, an interconnection (220" of FIG. 13) may be then formed on the first interlayer insulating layer 202.

According to the modified embodiments described above, the resistivity of the adhesive pattern 308b may also be reduced using an annealing process performed after deposition of the adhesive layer 308 and/or using a program current forced into the phase change memory cell after formation of the interconnection 220".

According to the embodiments described above, an adhesive pattern containing carbon may be disposed between, and in some embodiments disposed directly between, a heating electrode and a phase change material pattern. Thus, the adhesive pattern may still have excellent adhesion even though a temperature of the phase change material pattern is varied within a specific range, for example, within a range of about a room temperature to a melting point of the phase change material pattern. As a result, a phase change memory device having an excellent endurance characteristic may be realized.

Although the present invention has been described in connection with the embodiment of the present invention illustrated in the accompanying drawings, it is not limited thereto. It will be apparent to those skilled in the art that various substitutions, modifications and changes may be made without departing from the scope and spirit of the invention.

The invention claimed is:

1. A phase change memory device, comprising:
a substrate;
a heating electrode on the substrate;
a phase change material pattern on the substrate; and
an adhesive pattern disposed between the heating electrode and the phase change material pattern, the adhesive pattern comprising carbon,
wherein a portion of the phase change material adjacent to the adhesive pattern comprises carbon, and wherein the concentration of carbon in the phase change material decreases as a function of distance away from the adhesive pattern.

2. The device as set forth in claim 1, further comprising an interlayer insulating layer disposed on the substrate and including an opening therein which extends through the interlayer insulating layer,
wherein the heating electrode is disposed in the opening.

3. The device as set forth in claim 2, wherein the heating electrode has a top surface which is substantially coplanar with a top surface of the interlayer insulating layer, wherein the adhesive pattern and the phase change material pattern are sequentially stacked on the interlayer insulating layer, and wherein the adhesive pattern is in direct contact with the top surface of the heating electrode.

4. The device as set forth in claim 2, wherein the heating electrode is in a lower portion of the opening, wherein at least a portion of the phase change material pattern is disposed in an upper portion of the opening, and wherein the adhesive pattern is disposed between the heating electrode and the phase change material pattern in the opening.

5. The device as set forth in claim 4, wherein a top surface of the phase change material pattern is substantially coplanar with a top surface of the interlayer insulating layer.

6. The device as set forth in claim 5, further comprising an interconnection disposed on the interlayer insulating layer and electrically connected to the phase change material pattern.

7. The device as set forth in claim 4, wherein a top surface of the phase change material pattern is located farther away from the substrate than a top surface of the interlayer insulating layer, and wherein the phase change material pattern covers a portion of the top surface of the interlayer insulating layer outside the opening.

8. The device as set forth in claim 4, wherein an edge of the adhesive pattern extends to intervene between the phase change material pattern and the interlayer insulating layer.

9. The device as set forth in claim 8, wherein the phase change material pattern, the extension of the adhesive pattern and the interlayer insulating layer have top surfaces which are substantially coplanar with each other.

10. The device as set forth in claim 8, wherein a top surface of the phase change material pattern is located farther away from the substrate than a top surface of the interlayer insulating layer, wherein the phase change material pattern covers a portion of the top surface of the interlayer insulating layer outside the opening, and wherein the adhesive pattern further extends to intervene between the phase change material pattern and the top surface of the interlayer insulating layer.

11. The device as set forth in claim 1 wherein a portion of the phase change material pattern remote from the adhesive pattern is free of carbon.

12. The device as set forth in claim 1 wherein the adhesive pattern consists essentially of carbon.

13. The device as set forth in claim 1 wherein the adhesive pattern comprises a chemical compound that includes carbon.

* * * * *